(12) United States Patent
Kang

(10) Patent No.: US 6,747,909 B2
(45) Date of Patent: Jun. 8, 2004

(54) DECODING APPARATUS FOR SEMICONDUCTOR MEMORY DEVICE, AND ENABLE METHOD THEREFORE

(75) Inventor: Sang Hee Kang, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 17 days.

(21) Appl. No.: 10/331,746

(22) Filed: Dec. 30, 2002

(65) Prior Publication Data

US 2003/0214873 A1 Nov. 20, 2003

(30) Foreign Application Priority Data

May 17, 2002 (KR) ........................................ 2002-27518

(51) Int. Cl.[7] .................................................. G11C 8/00
(52) U.S. Cl. .......................... 365/230.06; 365/230.08; 365/233.5
(58) Field of Search .................... 365/196, 230.06, 365/230.08, 233.5

(56) References Cited

U.S. PATENT DOCUMENTS

| | | | |
|---|---|---|---|
| 5,438,548 A | | 8/1995 | Houston |
| 5,694,370 A | * | 12/1997 | Yoon ........................ 365/233.5 |
| 5,715,208 A | | 2/1998 | Casper et al. |
| 5,764,591 A | * | 6/1998 | Matsui et al. ............. 365/233.5 |
| 5,831,927 A | * | 11/1998 | Casper et al. ........... 365/230.06 |
| 5,949,737 A | | 9/1999 | Casper et al. |
| 6,385,078 B2 | * | 5/2002 | Jeon ............................ 365/145 |

* cited by examiner

Primary Examiner—Son Mai
(74) Attorney, Agent, or Firm—Marshall, Gerstein & Borun LLP

(57) ABSTRACT

The present disclosure discloses a decoding apparatus for a semiconductor memory device and an enable method therefor which can remove unnecessary delay between an address inputted to a decoder and a decoder control signal by enabling the decoder in response to the decoder control signal generated by combining an address latch control signal and an internal address according to an output signal from an address latch. The decoding apparatus for the semiconductor memory device includes an address latch to output first and second latch addresses and an internal address by latching an input address in response to an address latch control signal, an address transition detector to generate a decoder control signal by operating the address latch control signal and the internal address according to the first and second latch addresses, and a decoder enabled according to the decoder control signal.

12 Claims, 14 Drawing Sheets

| A | B | F |
|---|---|---|
| 0 | 0 | 0 |
| 0 | 1 | 1 |
| 1 | 0 | 1 |
| 1 | 1 | 0 |

Fig.8

DECODING APPARATUS FOR SEMICONDUCTOR MEMORY DEVICE, AND ENABLE METHOD THEREFORE

TECHNICAL FIELD

The present disclosure relates to a decoding apparatus for a semiconductor memory device, and more particularly, to an improved decoding apparatus configured to decode an address in the DRAM.

BACKGROUND

A semiconductor memory device includes an address latch and a decoder. One example of improving a driving operation between the address latch and the decoder has been disclosed in Japanese Patent Laid-Open 11-16362 'Memory data read circuit' for controlling driving of an address decoding unit by using a built-in pulse generating circuit.

The address latch and the decoder are controlled to guarantee validity of addresses input to the decoder. FIGS. 1 and 2 are block diagrams illustrating a conventional decoding apparatus for a semiconductor memory device.

Referring to FIG. 1, the conventional decoding apparatus includes an address latch 10 enabled according to an address latch control signal XAE for transmitting inputted addresses ADD<0-N> to a special bank, a delay unit 11 for delaying the address latch control signal XAE and generating a decoder control signal XAED, and a decoder 12 enabled according to the decoder control signal XAED for decoding latch addresses BXAZ<0-N> of the address latch 10. As illustrated in FIG. 2, the decoder 12 can be divided into a predecoder 13 and a main decoder 14.

Still referring to FIG. 1, when the address latch 10 receives an active command, it latches the inputted address ADD<0-N> in response to the address latch control signal XAE of the selected bank. Even if the inputted address ADD<0-N> is varied, the address latch 10 constantly maintains the output BXAZ<0-N> until it receives a precharge command.

As described above, the conventional decoding apparatus enables the decoder 12 by using the decoder control signal XAED obtained by delaying the address latch control signal XAE. That is, in order to guarantee validity of the addresses BXAZ<0-N> input to the decoder 12 (or predecoder 13), the decoder control signal XAED is generated by delaying the address latch control signal XAE for a predetermined time.

However, the state of the output signal is varied due to variations of the process, temperature and voltage, and thus the address latch control signal XAE must be sufficiently delayed with a margin in order to generate the decoder control signal XAED. When the delay time is deficient, a glitch is generated in the output of the decoder 12, thereby increasing current consumption or generating a misoperation.

As a result, the conventional decoding apparatus for the semiconductor memory device generates signal transmission delay between the address latch and the decoder, and thus fails to improve an operation speed.

SUMMARY OF THE DISCLOSURE

A decoding apparatus configured to remove unnecessary delay between an address input to a decoder and a decoder control signal by enabling the decoder in response to the decoder control signal generated by logically combining an address latch control signal and an internal address according to an output signal from an address latch is disclosed herein.

The decoding apparatus for a semiconductor memory device includes: an address latch to output first and second latch addresses and an internal address by latching an input address in response to an address latch control signal; an address transition detector to generate a decoder control signal by logically operating the address latch control signal and the internal address according to the first and second latch addresses; and a decoder enabled according to the decoder control signal.

An enable method of a decoding apparatus for a semiconductor memory device includes the steps of: generating first and second latch addresses and an internal address by latching an input address in response to an address latch control signal; generating a decoder control signal by logically operating the address latch control signal and the internal address according to the first and second latch addresses; and enabling a decoder in response to the decoder control signal.

BRIEF DESCRIPTION OF THE DRAWINGS

The disclosure will be described in terms of several embodiments to illustrate its broad teachings. Reference is also made to the attached drawings.

FIG. 8 is a truth table of the XOR logic circuit of FIGS. 7a and 7b;

DETAILED DESCRIPTION OF THE PREFERRED EMBODIMENTS

The present disclosure will be described in detail with reference to the accompanying drawings. In accordance with the present disclosure, when an address latch is enabled to latch a valid address according to an address latch control signal, an address transition detector detects that the latched valid address is output according to the address latch control signal, thereby generating a decoder control signal to enable a decoder.

Figure 1:
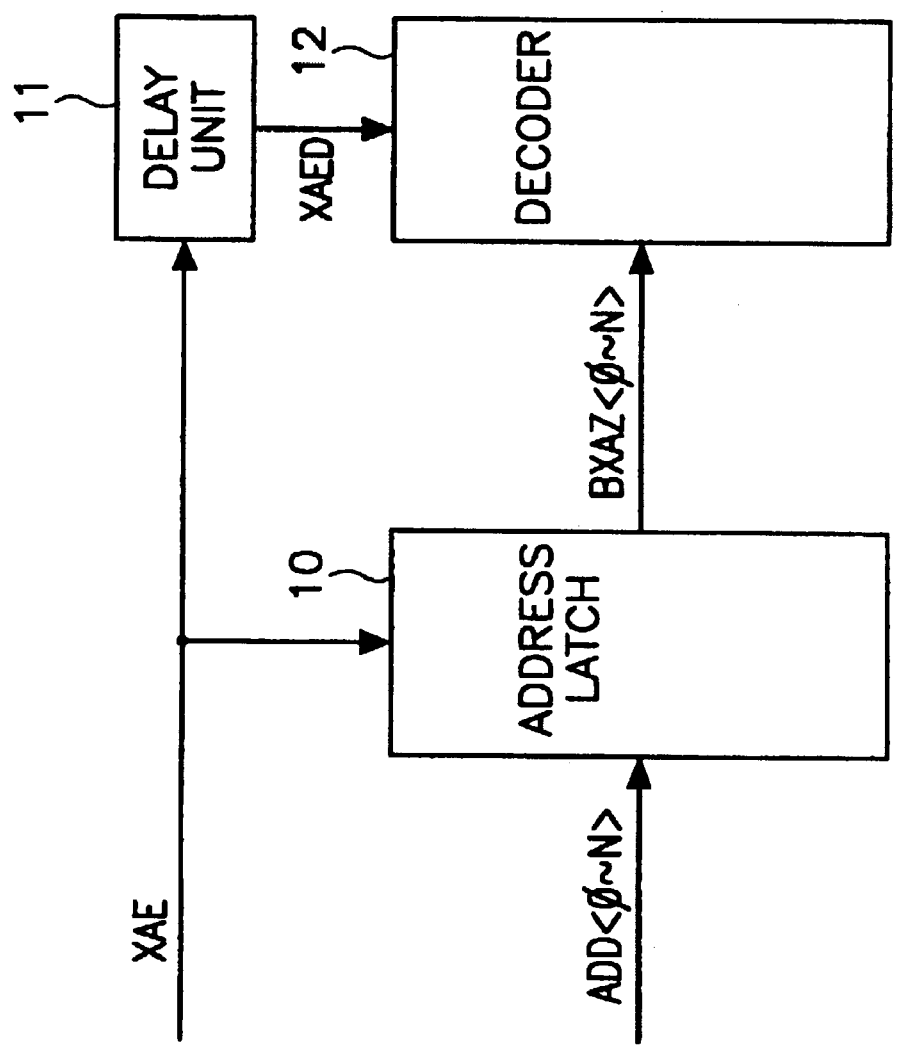
FIGS. 1 and 2 are block diagrams respectively illustrating a conventional decoding apparatus for a semiconductor memory device.
Figure 2:
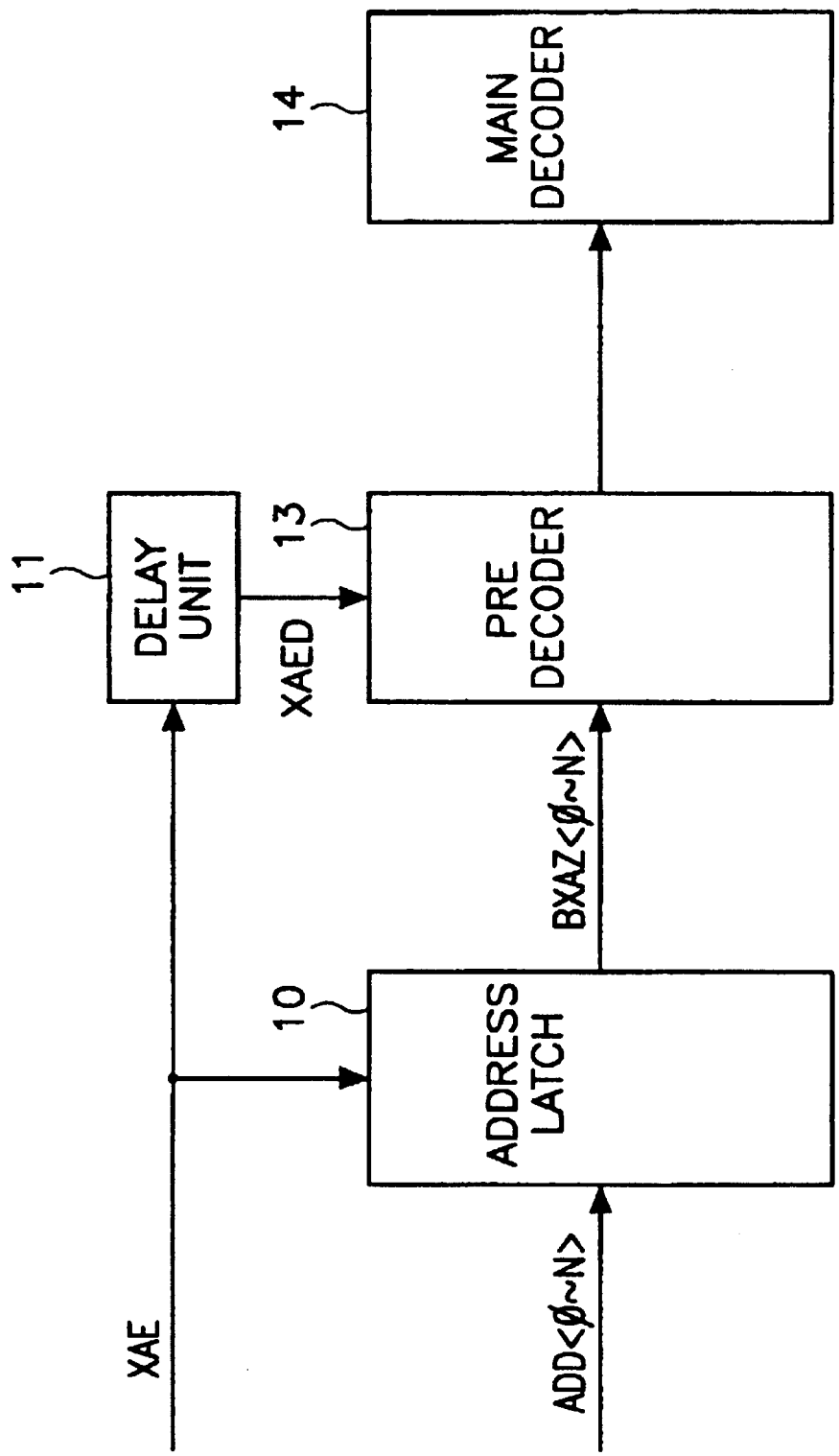
Figure 3:
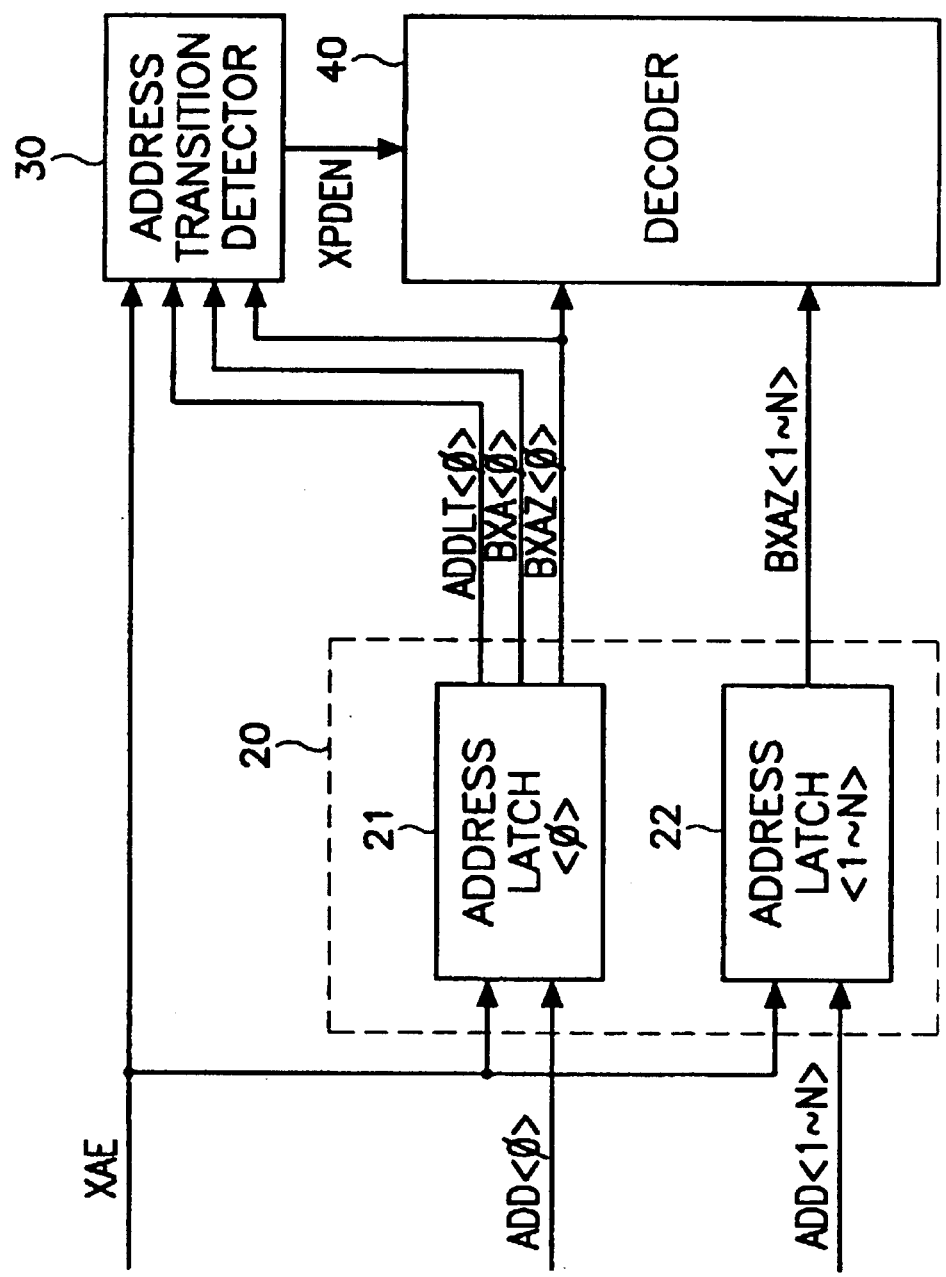
FIGS. 3 and 4 are block diagrams respectively illustrating a decoding apparatus for a semiconductor memory device in accordance with a preferred embodiment of the present disclosure.
Figure 4:
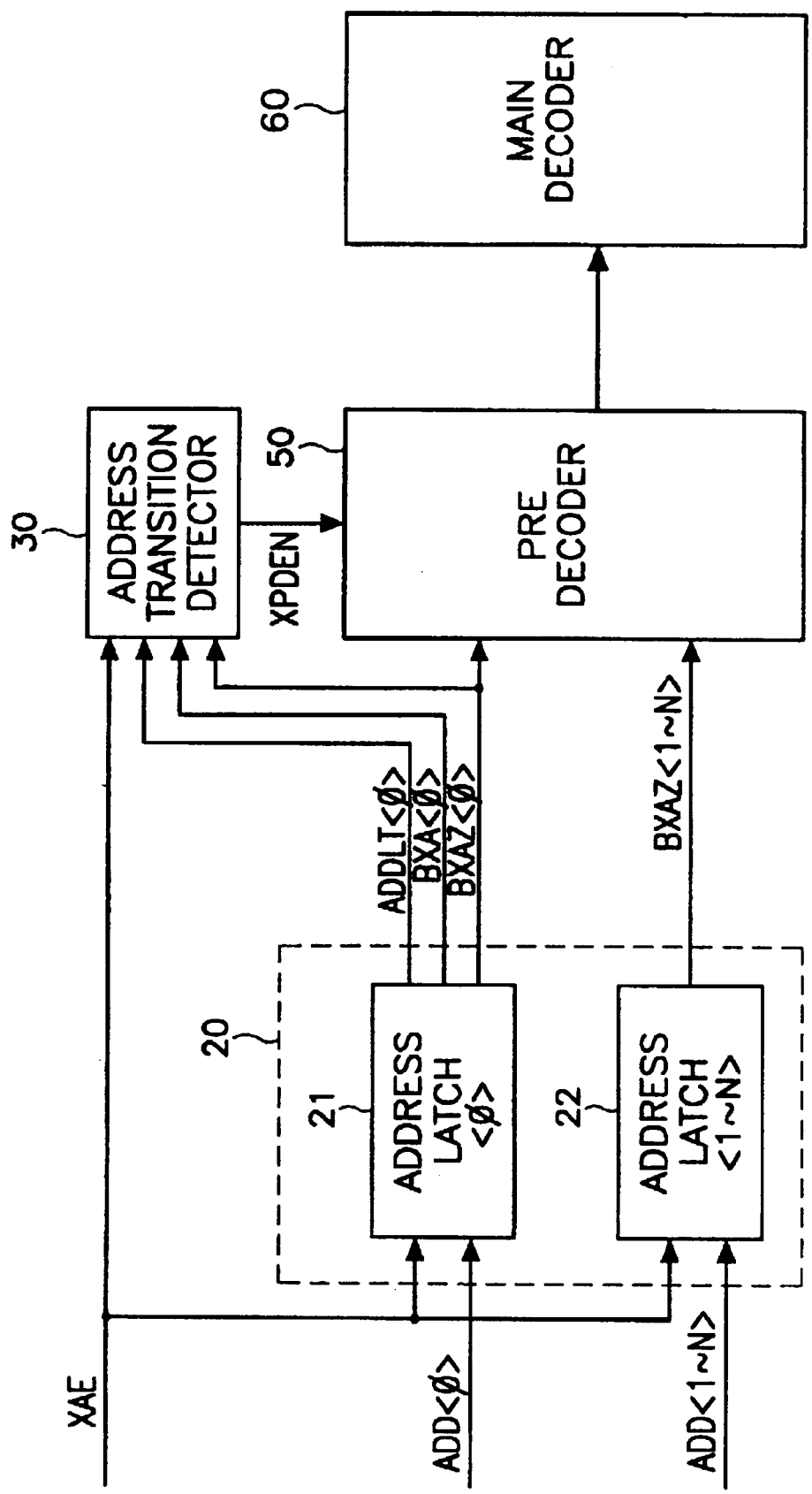

FIGS. 3 and 4 are block diagrams respectively illustrating the decoding apparatus for the semiconductor memory device in accordance with a preferred embodiment of the present disclosure. In FIGS. 3 and 4, ADD<0-N> denotes external input addresses inputted to a chip according to a chip operation mode, and ADDLT<0> denotes an internal address obtained by latching the input address. BXA<0> and BXAZ<0> denote latch addresses generated in the chip. XAE is an address latch control signal to enable or disable an address latch 20, and latch a valid address in a specific time. XPDEN denotes a decoder control signal to enable or disable a decoder 40 (or predecoder 50).

Referring to FIG. 3, the decoding apparatus includes the address latch 20, the address transition detector 30 and the decoder 40. The address latch 20 includes address latches <0> and <1-N>.

The address latch <0> is enabled according to the address latch control signal XAE, to latch the address ADD<0> and generate the latch addresses BXA<0> and BXAZ<0> and the internal address ADDLT<0>. The address latch <1-N> is enabled according to the address latch control signal XAE, to latch the address ADD<1-N> and generate a latch address BXAZ<1-N>. The address transition detector 30 logically operates the address latch signal XAE and the internal address ADDLT<0> in response to the latch addresses BXA<0> and BXAZ<0>, and generates the decoder control signal XPDEN. The decoder 40 is enabled according to the decoder control signal XPDEN.

Here, when the address latch <0> is disabled in response to the address latch control signal XAE, the address latch <0> constantly maintains the latch address BXAZ<0> regardless of the input address ADD<0>. Conversely, when the address latch <0> is enabled in response to the address latch control signal XAE, the address latch <0> maintains the latch address BXAZ<0> corresponding to the address ADD<0> inputted in an enable time. The address latch <1-N> is operated in the same manner as the address latch <0>.

When the decoder 40 is enabled in response to the decoder control signal XPDEN, the output corresponding to the inputted address BXAZ<0-N> is determined. Conversely, when the decoder 40 is disabled in response to the decoder control signal XPDEN, all the outputs are maintained in the same state regardless of the inputted address BXAZ<0-N>.

Figure 5:
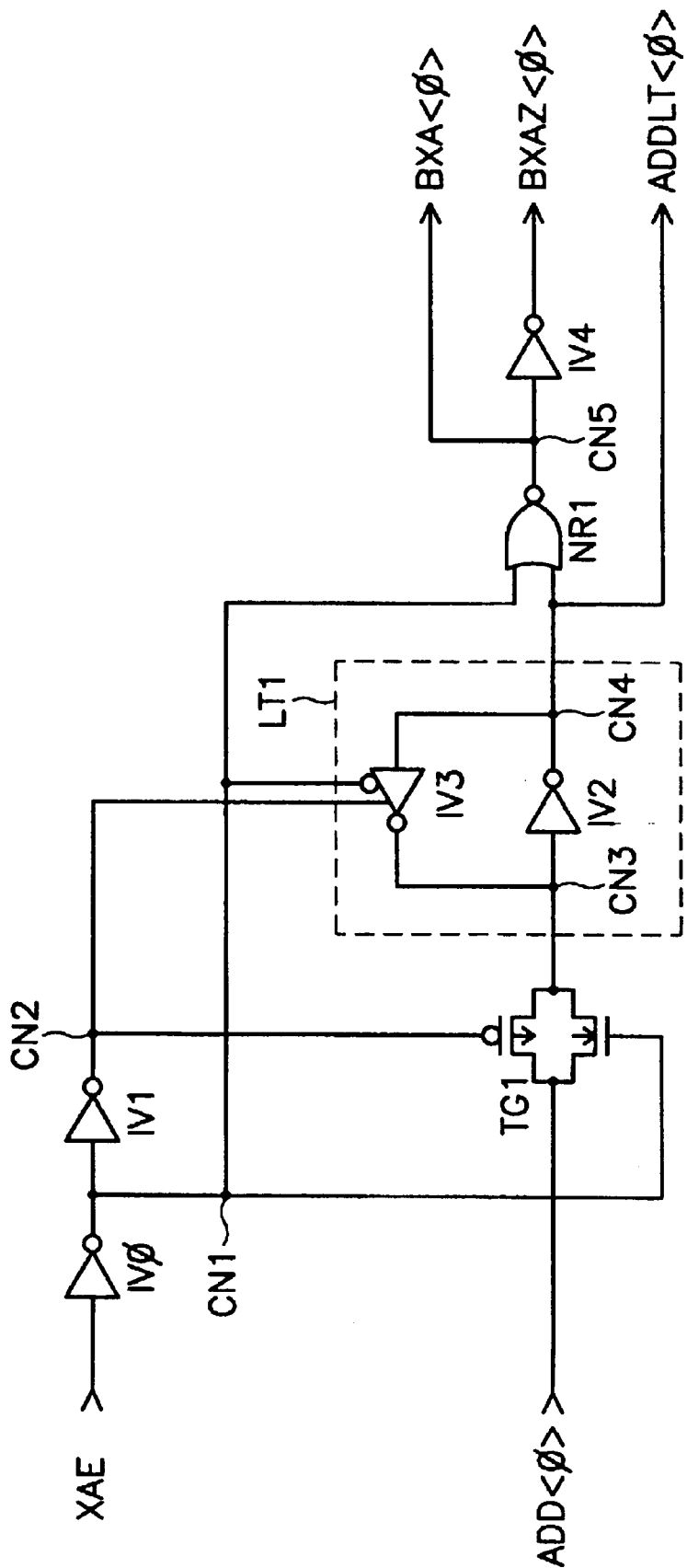
FIG. 5 is a circuit diagram illustrating an address latch of FIGS. 3 and 4.

FIG. 5 is a circuit diagram illustrating the address latch <0> of FIGS. 3 and 4. The address latch <1-N> has the same structure as the address latch <0>.

In the address latch <0>, an inverter IV0 inverts the address latch control signal XAE, and an inverter IV1 inverts the output signal from the inverter IV0. A transmission gate TG1 transmits the inputted address ADD<0> to a latch circuit LT1 according to the output signals from the inverters IV0 and IV1. The latch circuit LT1 latches the output signal from the transmission gate TG1. A NOR gate NR1 NORs the output signal from the inverter IV0 and the internal address ADDLT<0> which is the output from the latch circuit LT1, and outputs the latch address BXA<0>. An inverter IV4 inverts the latch address BXA<0>, and outputs the latch address BXAZ<0>.

Here, when the address latch control signal XAE has a low level, the address latch <0> is disabled. That is, since a node CN1 has a high level and a node CN2 has a low level, the transmission gate TG1 is turned on to transmit the inputted address ADD<0> to the latch circuit LT1. However, the latch circuit LT1 cannot perform the latch function because an inverter IV3 is disabled. Therefore, the output signal from the NOR gate NR1 maintains a low level regardless of a level of the inputted address ADD<0>.

Thereafter, when the valid address ADD<0> is inputted to enable the address latch control signal XAE in a high level, the address latch <0> is enabled. Since the node CN1 has a low level and the node CN2 has a high level, the transmission gate TG1 is turned off. However, the inverter IV3 is enabled to activate the latch circuit LT1, and thus a level of a node CN3 and a level of a node CN4 are fixed. The node CN1 has a low level, and thus a level of the output signal from the NOR gate NR1, namely a level of the latch address BXA<0> is determined according to the inputted address ADD<0>. The latch address BXAZ<0> is generated by inverting the latch address BXA<0>, and inputted to the decoder 40 or predecoder 50.

Figure 6:
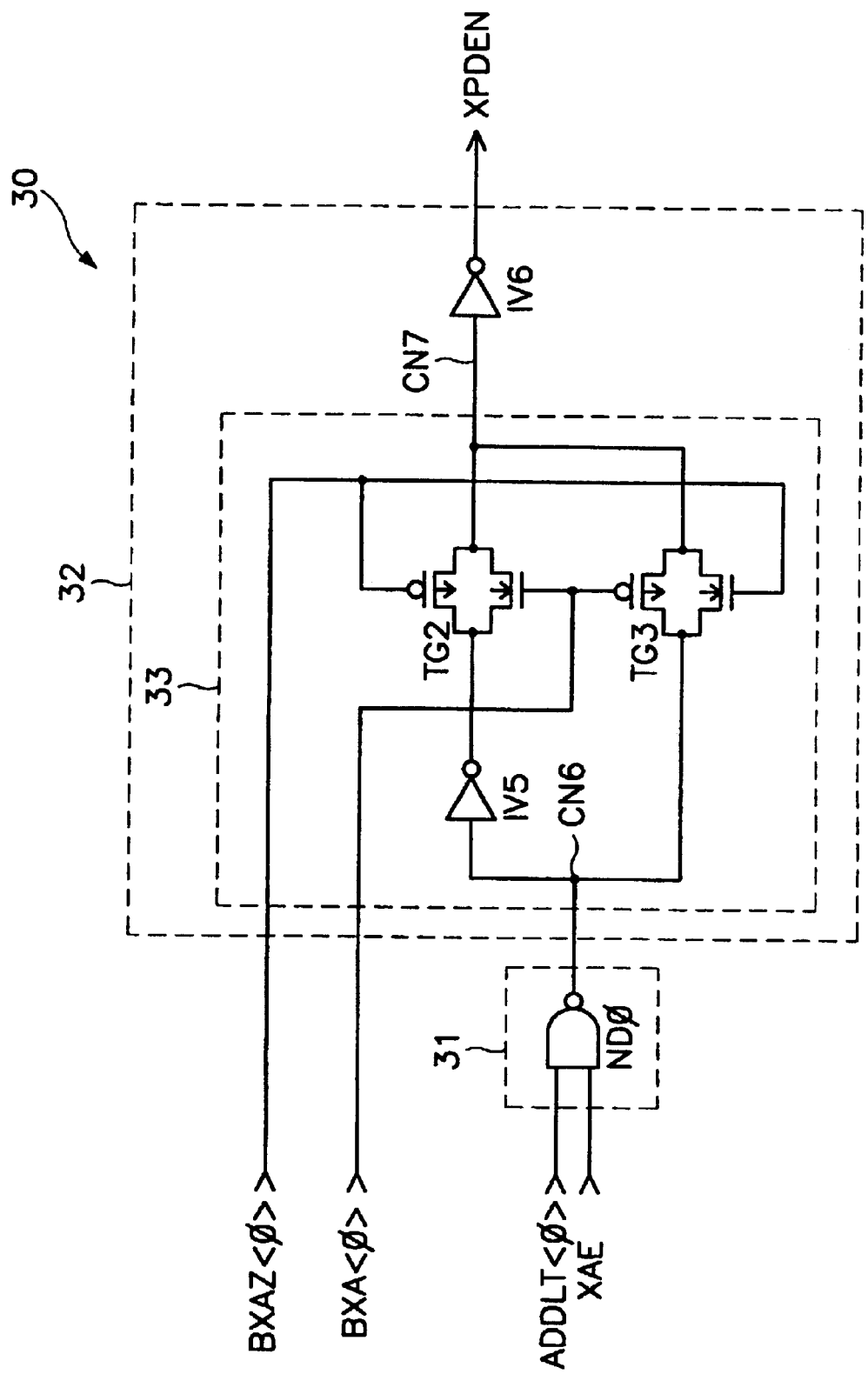
FIG. 6 is a circuit diagram illustrating an address transition detector of FIGS. 3 and 4.

FIG. 6 is a circuit diagram illustrating the address transition detector 30 of FIGS. 3 and 4. The address transition detector 30 includes a phase controller 31 to control a phase of the address in response to the internal address ADDLT<0> and the address latch control signal XAE, and a phase transmitter 32 to receive the output signal from the phase controller 31 and generate the decoder control signal XPDEN according to the latch addresses BXA<0> and BXAX<0>.

The phase controller 31 includes a NAND gate ND0 to NAND the internal address ADDLT<0> and the address latch control signal XAE. The phase transmitter 32 has an XOR logic circuit 33 to transmit an inverted signal of the output signal from the phase controller 31 according to the latch addresses BXA<0> and BXAZ<0>, and an inverter IV6 to invert the output signal from the XOR logic circuit 33, and output the decoder control signal XPDEN.

The XOR logic circuit 33 includes a transmission gate TG2 to transmit an inverted signal of the output signal from the phase controller 31 according to the latch addresses BXA<0> and BXAZ<0>, and a transmission gate TG3 to transmit the output signal from the phase controller 31 according to the latch addresses BXA<0> and BXAZ<0>.

Here, when the address latch control signal XAE has a low level, the latch address BXA<0> maintains a low level and the latch address BXAZ<0> maintains a high level regardless of the internal address ADDLT<0>. The internal address ADDLT<0> is not associated with the latch addresses BXA<0> and BXAZ<0>. However, when the address latch control signal XAE has a high level, the internal address ADDLT<0> and the latch address BXA<0> always have inversion relation.

As described above, when the address latch control signal XAE has a low level, the latch address BXA<0> maintains a low level and the latch address BXAZ<0> maintains a high level. The transmission gates TG2 and TG3 are controlled in this way to maintain the decoder control signal XPDEN in a low level. The NAND gate ND0 receives the internal address ADDLT<0> and the address latch control signal XAE to maintain the decoder control signal XPDEN in a low level. The NAND gate ND0 is added to maintain the output signal of the phase controller 31 at a high level.

Conversely, when the address latch control signal XAE has a high level, the output signal from the phase controller 31 and the latch address BXA<0> always have the same phase. Accordingly, the XOR logic circuit 33 that receives the latch addresses BXA<0> and BXAZ<0> and the output signal from the phase controller 31 is configured so that the internal address ADDLT<0> and the latch address BXA<0> can always have inversion relation.

Figure 7A:
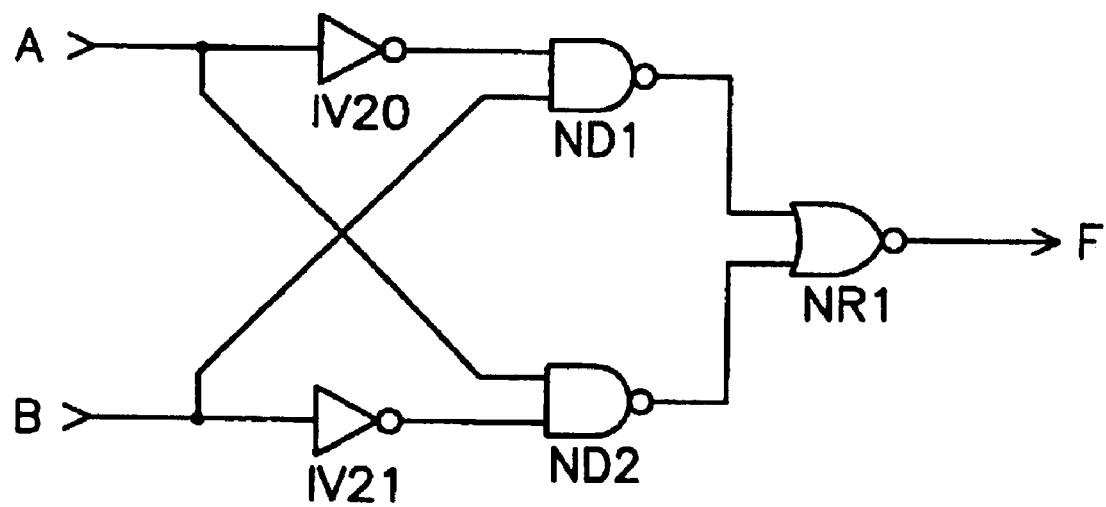
FIGS. 7a and 7b are circuit diagrams respectively illustrating an XOR logic circuit of FIG. 6.
Figure 7B:
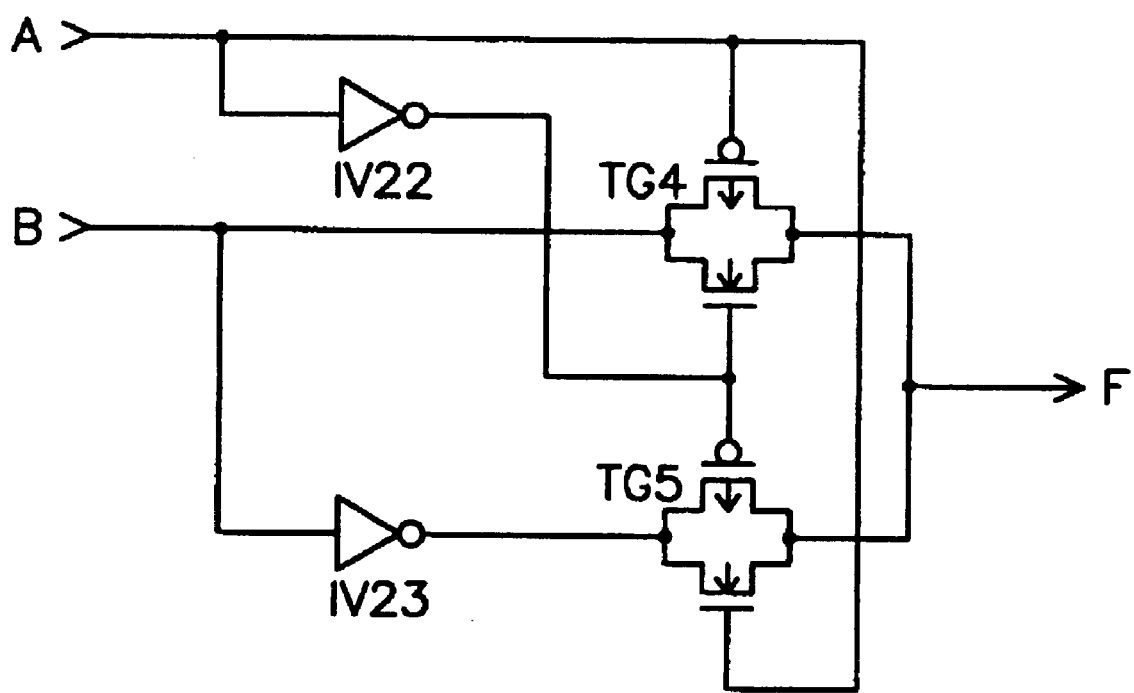
Figure 8:
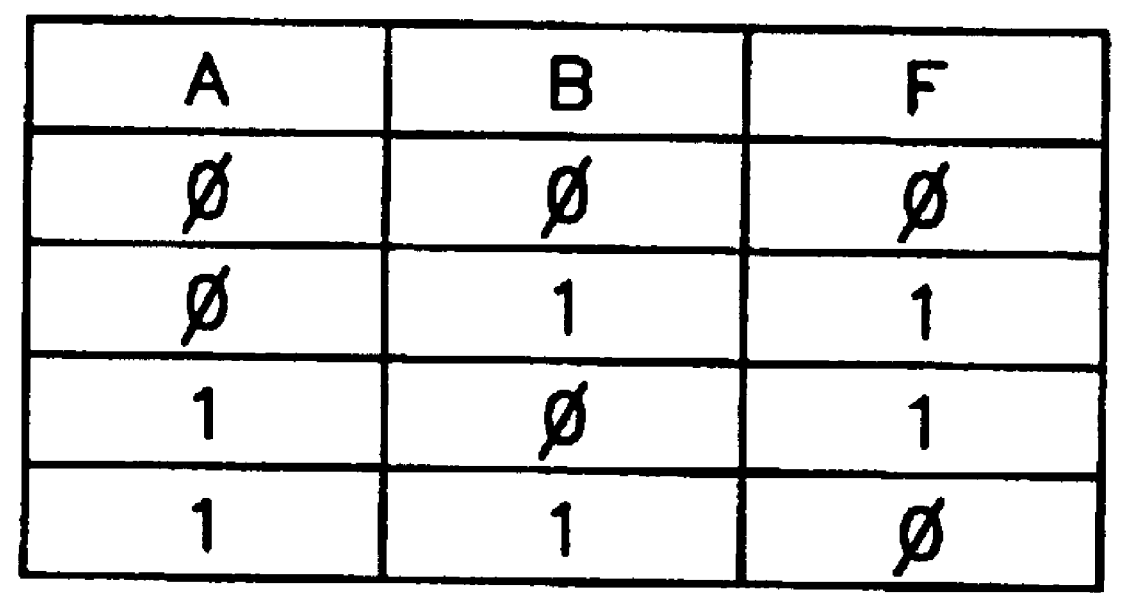

FIGS. 7a and 7b are circuit diagrams respectively illustrating the XOR logic circuit 33, and FIG. 8 is a truth table of the phase transmitter 32. FIG. 7a shows an XOR logic circuit using a logic gate, and FIG. 7b shows an XOR logic gate using a transmission gate. In FIGS. 7a and 7b, A denotes the latch address BXA<0>, B denotes the output signal from the phase controller 31, and F denotes the output signal from the XOR logic circuit 33.

As depicted in FIG. 7a, the XOR logic circuit includes an inverter IV20 to invert the signal A, an inverter IV21 to invert the signal B, a NAND gate ND1 to NAND the output signal from the inverter IV20 and the signal B, a NAND gate ND2 to NAND the signal A and the output signal from the inverter IV21, and a NOR gate NR2 to NOR the output signals from the NAND gates ND1 and ND2.

As shown in FIG. 7b, the XOR logic circuit includes an inverter IV22 to invert the signal A, an inverter IV23 to invert the signal B, a transmission gate TG4 to transmit the signal B according to the signal A and the output signal from the inverter IV22, and a transmission gate TG5 to transmit the output signal from the inverter IV23 according to the signal A and the output signal from the inverter IV22.

Here, when the address latch control signal XAE has a low level, the latch address BXA<0> (signal A) and the output signal (signal B) from the phase controller 31 have the opposite phases as shown in FIG. 8. Accordingly, the output signal (signal F) from the XOR logic circuit 33 has a high level, and the decoder control signal XPDEN has a low level, thereby disabling the decoder 40. When the address latch control signal XAE has a high level, the latch address BXA<0> (signal A) and the output signal (signal B) from the phase controller 31 have the same phase. Therefore, the output signal (signal F) from the XOR logic circuit has a low level, and the decoder control signal XPDEN has a high level, thereby enabling the decoder 40.

Figure 9:
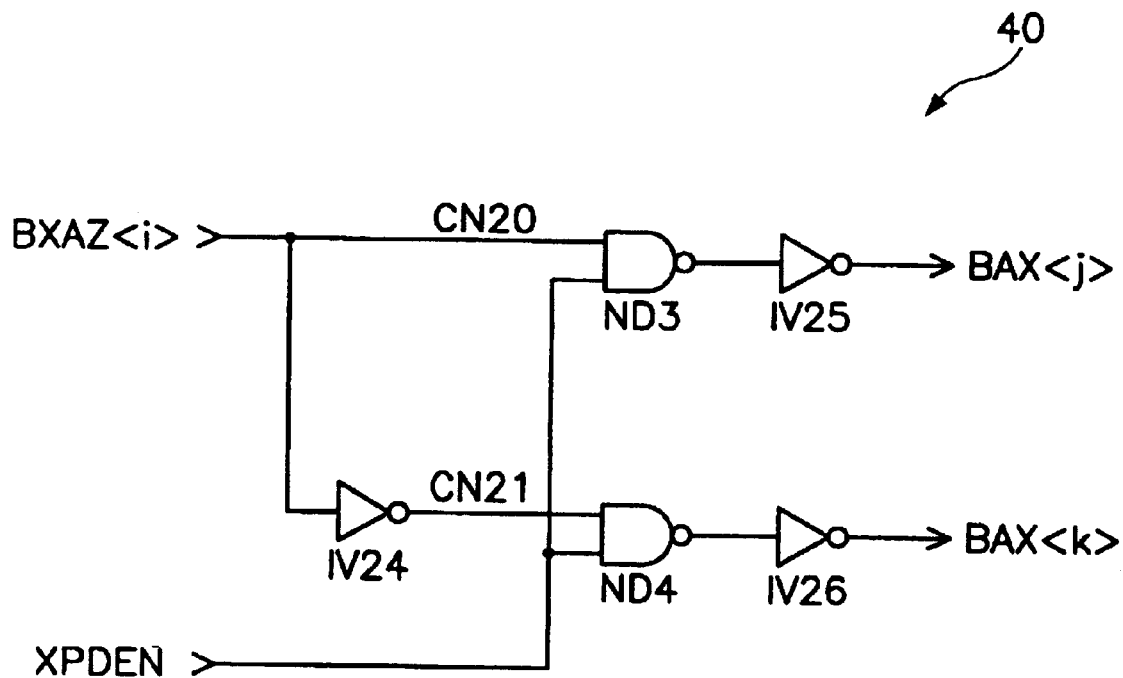
FIG. 9 is a circuit diagram illustrating a decoder of FIG. 3.

FIG. 9 is a circuit diagram illustrating the decoder 40 of FIG. 3. The decoder 40 is enabled according to the decoder control signal XPDEN, to decode a latch address BAX<i> and output decoded addresses BAX<j> and BAX<k>.

In the decoder 40, an inverter IV24 inverts a latch address BAXZ<i>, and a NAND gate ND3 NANDs the decoder control signal XPDEN and the latch address BAXZ<i>. A NAND gate ND4 NANDs the output signal from the inverter IV24 and the decoder control signal XPDEN. An inverter IV25 inverts the output signal from the NAND gate ND3 and outputs the decoded address BAX<j>, and an inverter IV26 inverts the output signal from the NAND gate ND4 and outputs the decoded address BAX<k>.

Here, when a valid address is transmitted to a node CN20 and a node CN21, the decoder control signal XPDEN is transited from a low to high level. The NAND gate ND3 and the NAND gate ND4 output an operation result of the node CND20, the node CN21 and the decoder control signal XPDEN.

Figure 10:
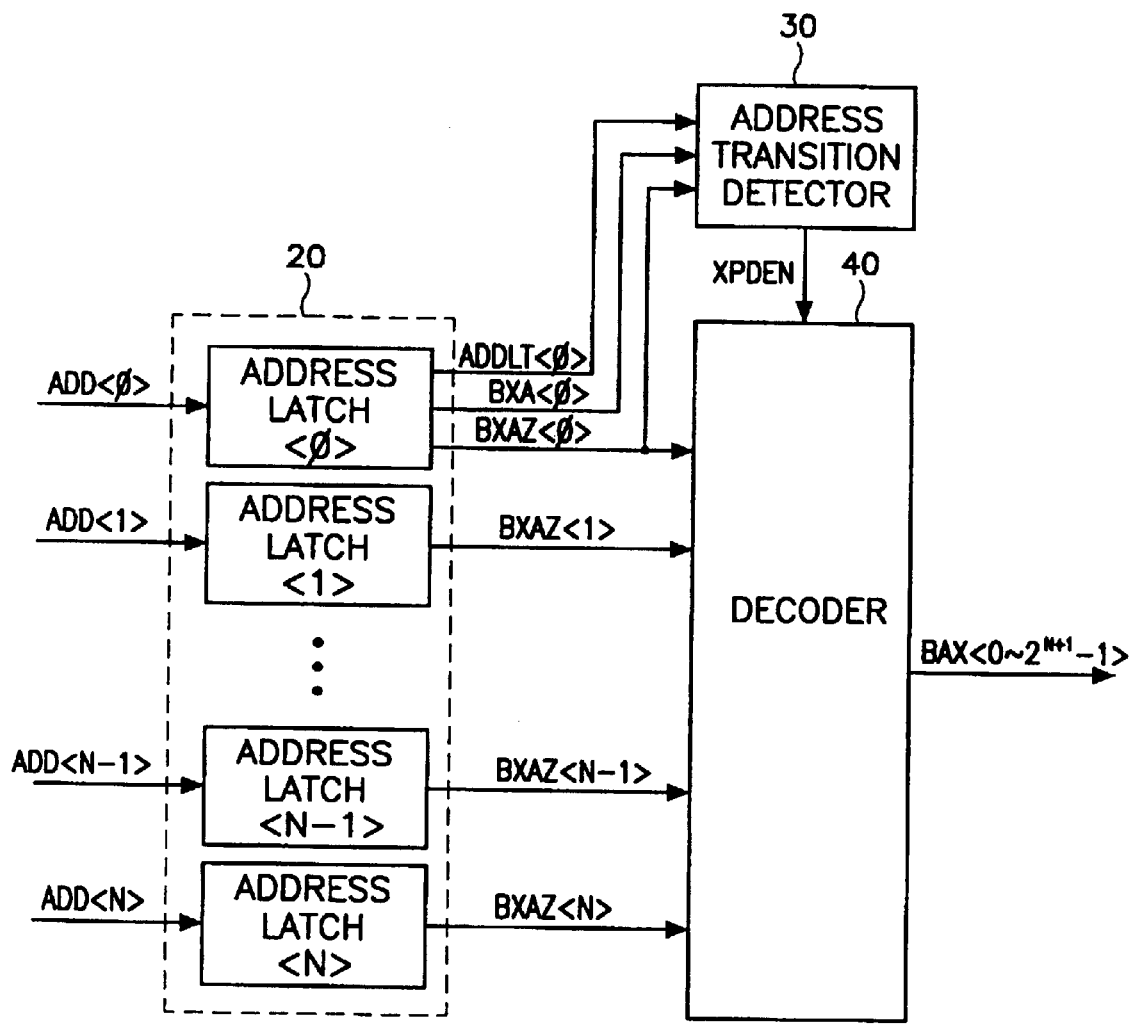
FIGS. 10 to 13 are layout diagrams respectively illustrating the decoding apparatus for the semiconductor memory device in accordance with the preferred embodiment of the present disclosure.

FIGS. 10 to 13 are layout diagrams respectively illustrating the address latch 20, the address transition detector 30 and the decoder 40. FIG. 10 shows a layout of the plurality of address latches 20, one address transition detector 30 and one decoder 40.

Referring to FIG. 10, one address transition detector 30 is positioned to correspond to the address latch <0>. The address transition detector 30 generates one decoder control signal XPDEN to control the decoder 40. One decoder 40 is installed to correspond to the plurality of address latches <0-N>.

Figure 11:
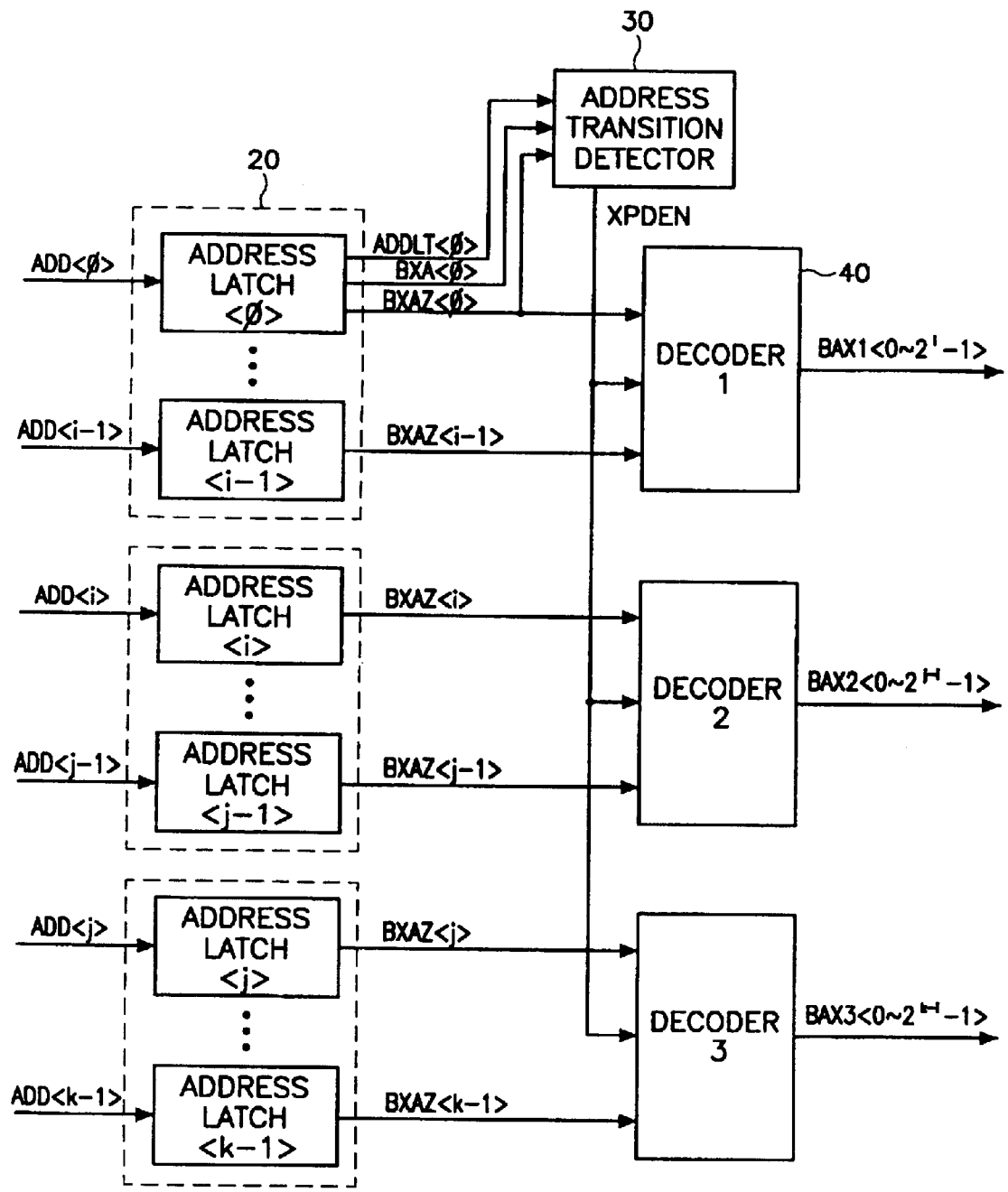

FIG. 11 shows a layout of the plurality of address latches 20, one address transition detector 30 and a plurality of decoders 40. As illustrated in FIG. 11, one address transition detector 30 is positioned to correspond to the address latch <0>. The address transition detector 30 generates one decoder control signal XPDEN to control the decoders 40. In addition, the plurality of address latches 20 are grouped in a predetermined number, and the plurality of decoders 40 are installed to correspond to each group.

Figure 12:
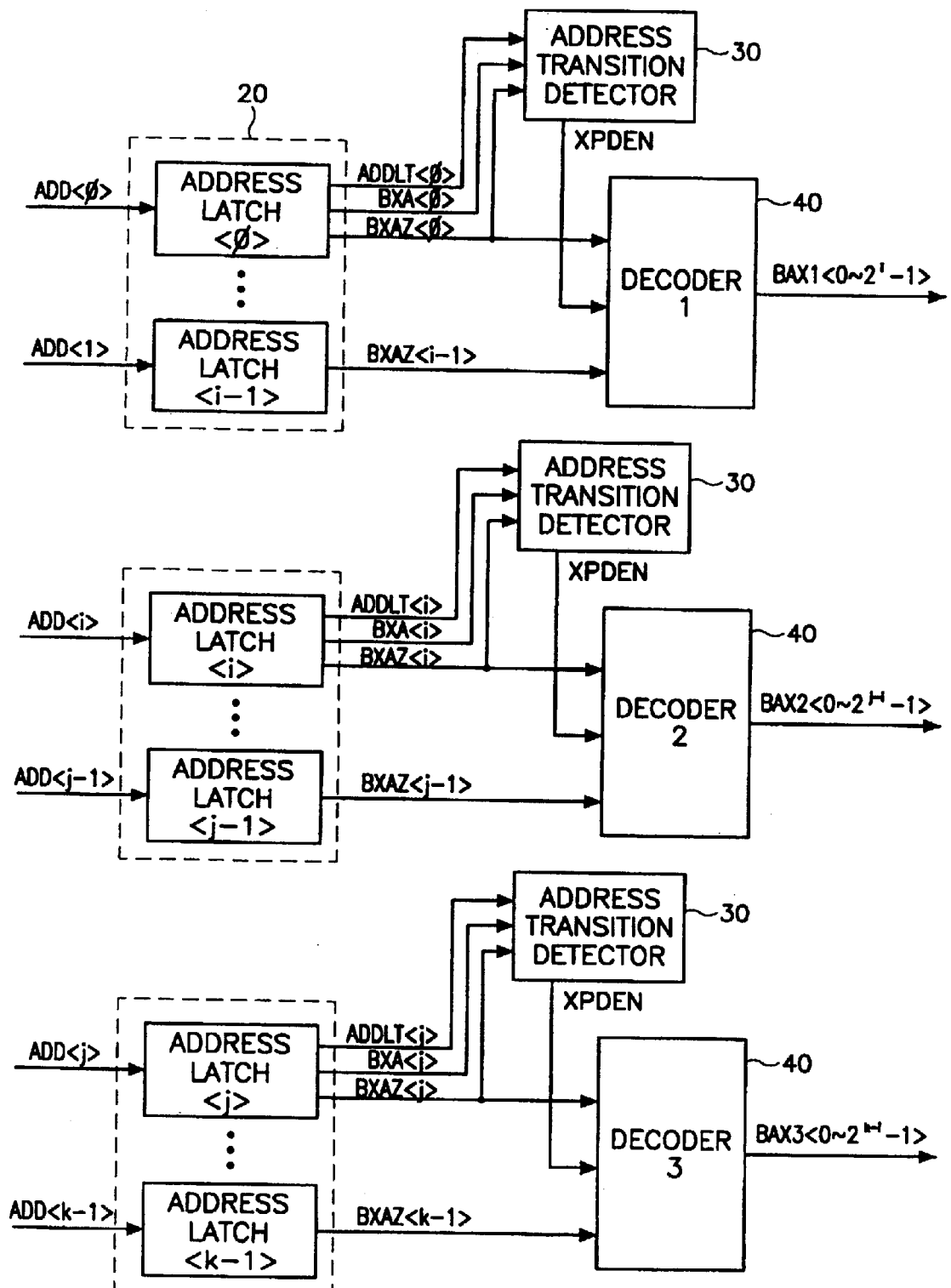

FIG. 12 shows a layout of the plurality of address latches 20, the plurality of address transition detectors 30 and the plurality of decoders 40. As depicted in FIG. 12, the address transition detectors 30 for at least one address are respectively positioned in the decoders 40. The address transition detectors 30 of the decoders 40 respectively generate the decoder control signals and control the decoders 40.

Figure 13:
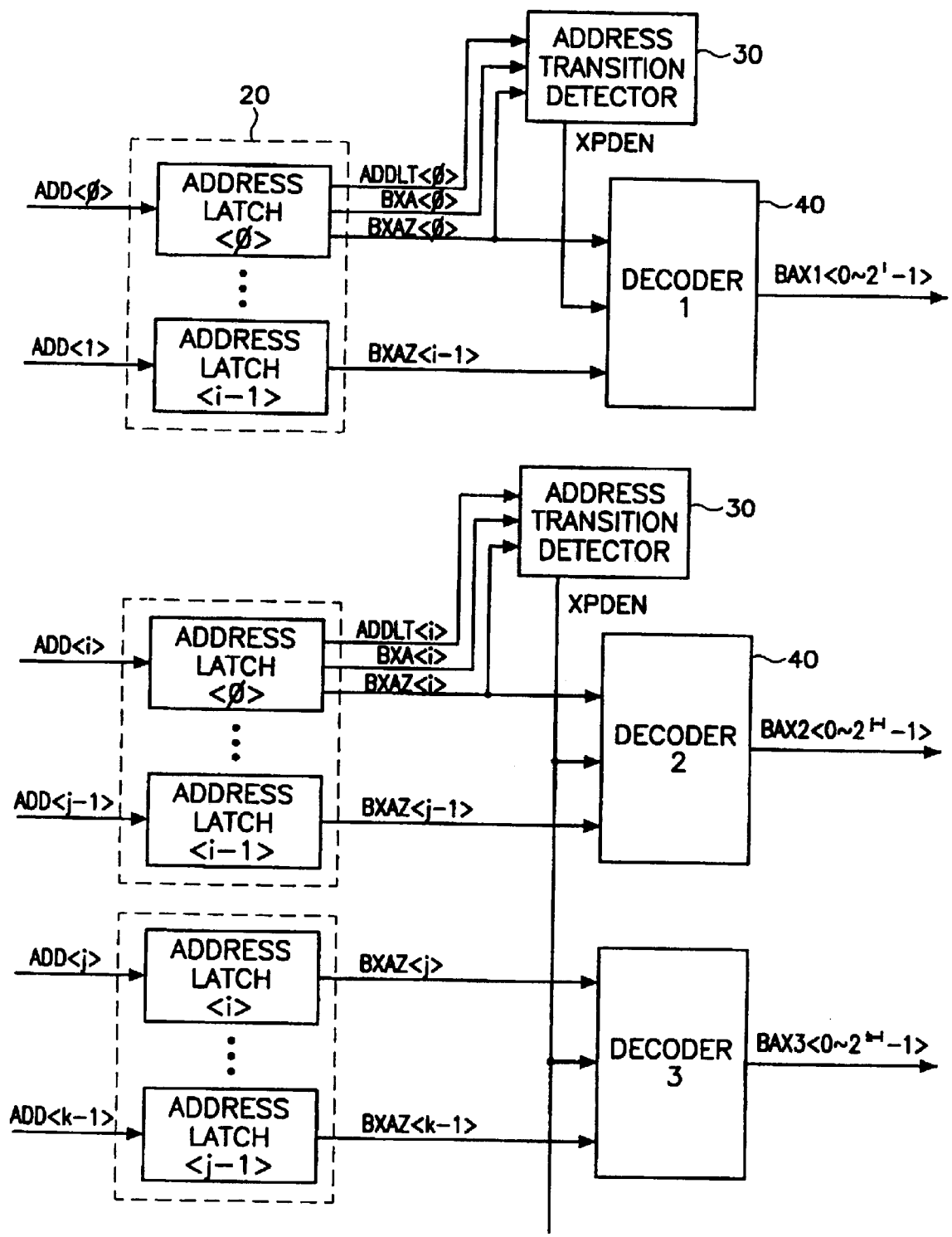

The circuit illustrated in FIG. 13 generates the decoder control signal and controls each decoder according to combinations of FIG. 11 and FIG. 12. As described above, the address transition detector 30 can be positioned in the address latch or decoder and a path of the address latch or decoder. As discussed earlier, in accordance with the present disclosure, the decoder control signal is generated by detecting that the valid address is outputted from the address latch, and the decoder is enabled in response to the decoder control signal, thereby removing unnecessary delay between the address inputted to the decoder and the decoder control signal. Therefore, the semiconductor memory device has an improved operation speed.

In addition, the decoder is enabled in response to the decoder control signal generated by detecting that the valid address is outputted from the address latch, thereby preventing a glitch in the output from the decoder due to mis-matching between the address and the decoder control signal due to variations of the process, temperature and voltage. Accordingly, unnecessary toggling is removed from the output from the decoder, to reduce power consumption and prevent mis-operation of the decoder.

Many changes and modifications to the embodiments described herein could be made. The scope of some changes is discussed above. The scope of others will become apparent from the appended claims.

What is claimed is:

1. A decoding apparatus for a semiconductor memory device, comprising:
   an address latch to output first and second latch addresses and an internal address by latching an input address in response to an address latch control signal;
   an address transition detector to generate a decoder control signal by logically operating the address latch control signal and the internal address according to the first and second latch addresses; and
   a decoder enabled according to the decoder control signal.

2. The apparatus according to claim 1, wherein the address transition detector comprises:
   a phase controller to logically operate the address latch control signal and the internal address; and
   a phase transmitter to transmit an output signal from the phase controller as the decoder control signal according to the first and second latch addresses.

3. The apparatus according to claim 2, wherein the phase controller comprises a NAND gate to NAND the address latch control signal and the internal address.

4. The apparatus according to claim 2, wherein the phase transmitter comprises:
   an XOR logic circuit to transmit the output signal from the phase controller according to the first and second latch addresses; and
   an inverter to invert the output signal from the XOR logic circuit, and output the decoder control signal.

5. The apparatus according to claim 4, wherein the XOR logic circuit comprises:
   a first transmission gate to transmit the output signal from the phase controller according to the first and second latch addresses; and a second transmission gate to transmit an inverted signal of the output signal from the phase controller according to the first and second latch addresses.

6. The apparatus according to claim 4, wherein the XOR logic circuit comprises:

a first NAND gate to NAND the second latch address and the output signal from the phase controller;

a second NAND gate to NAND the first latch address and an inverted signal of the output signal from the phase controller; and a NOR gate to NOR the output signals from the first and second NAND gates.

7. The apparatus according to claim 1, wherein the address transition detector generates the decoder control signal to control the decoder.

8. The apparatus according to claim 7, wherein a plurality of address transition detectors are respectively installed in a plurality of address latches to control a plurality of decoders.

9. The apparatus according to claim 1, wherein the decoder is a predecoder enabled according to the decoder control signal.

10. An enable method of a decoding apparatus for a semiconductor memory device, comprising the steps of:

generating first and second latch addresses and an internal address by latching an input address in response to an address latch control signal;

generating a decoder control signal by logically operating the address latch control signal and the internal address according to the first and second latch addresses; and enabling a decoder in response to the decoder control signal.

11. The enable method according to claim 10, further comprising controlling a plurality of decoders with the decoder control signal.

12. The enable method according to claim 10, further comprising generating the decoder control signal by transmitting a NAND operation result of the address latch control signal and the internal address according to the first and second latch addresses.

* * * * *

UNITED STATES PATENT AND TRADEMARK OFFICE
CERTIFICATE OF CORRECTION

PATENT NO.    : 6,747,909 B2
DATED         : June 8, 2004
INVENTOR(S)   : Sang Hee Kang It is certified that error appears in the above-identified patent and that said Letters Patent is hereby corrected as shown below:

<u>Title page,</u>
Item [75], Inventors, please delete "Seoul" and replace with -- Kyoungki-do --.

Signed and Sealed this

Twenty-first Day of December, 2004

JON W. DUDAS
*Director of the United States Patent and Trademark Office*